(12) United States Patent
Beckmann et al.

(10) Patent No.: US 9,750,150 B2
(45) Date of Patent: Aug. 29, 2017

(54) BREAK RESISTANT AND SHOCK RESISTANT SAPPHIRE PLATE

(71) Applicant: APPLE INC., Cupertino, CA (US)

(72) Inventors: Rudolf Beckmann, Hammersbach (DE); Sabine Nolker, Limeshain (DE)

(73) Assignee: APPLE INC., Cupertino, CA (US)

( * ) Notice: Subject to any disclaimer, the term of this patent is extended or adjusted under 35 U.S.C. 154(b) by 276 days.

(21) Appl. No.: 14/453,102

(22) Filed: Aug. 6, 2014

(65) Prior Publication Data

US 2014/0349095 A1 Nov. 27, 2014

Related U.S. Application Data

(63) Continuation of application No. 14/216,736, filed on Mar. 17, 2014, now abandoned.

(51) Int. Cl.
*C04B 35/115* (2006.01)
*C04B 41/87* (2006.01)
(Continued)

(52) U.S. Cl.
CPC .............. *H05K 5/03* (2013.01); *C04B 41/009* (2013.01); *C04B 41/5031* (2013.01); *C23C 14/081* (2013.01); *C23C 14/34* (2013.01); *C23C 16/403* (2013.01); *C23C 16/513* (2013.01); *C30B 29/20* (2013.01); *Y10T 428/2495* (2015.01); *Y10T 428/24967* (2015.01)

(58) Field of Classification Search
None
See application file for complete search history.

(56) References Cited

U.S. PATENT DOCUMENTS 3,809,574 A 5/1974 Duffy et al.
3,859,714 A 1/1975 DeLuca
(Continued)

FOREIGN PATENT DOCUMENTS

CN 102400213 4/2012
DE 69612997 T2 9/2001
(Continued)

OTHER PUBLICATIONS

Barbour JD et al., "The mechanical properties of alumina films formed by plasma deposition and by ion irradiation of sapphire," Nuclear Instruments & Methods in Physics Research, Section—B:Beam Interactions with Materials and Atoms, Elsevier, Amsterdam, NL, vol. 166-167, May 1, 2000, pp. 140-147.
(Continued)

*Primary Examiner* — David Sample
(74) *Attorney, Agent, or Firm* — Brownstein Hyatt Farber Schreck, LLP

(57) ABSTRACT

A break resistant sapphire plate and a corresponding production process. The sapphire plate may include a planar sapphire substrate, and at least one shock absorbing layer arranged on a surface of the substrate. The shock absorbing layer may have a thickness of between 0.1% to 10% of the thickness of the substrate. The production process for producing the sapphire plate may include providing a planar sapphire substrate, and coating at least one surface of the substrate with a shock absorbing layer. The shock absorbing layer may include a layer thickness between 0.1% to 10% of the thickness of the substrate.

20 Claims, 1 Drawing Sheet

(51) Int. Cl.

| | | |
|---|---|---|
| C23C 16/513 | (2006.01) | |
| C23C 14/34 | (2006.01) | |
| H05K 5/03 | (2006.01) | |
| C04B 41/50 | (2006.01) | |
| C04B 41/00 | (2006.01) | |
| C23C 14/08 | (2006.01) | |
| C23C 16/40 | (2006.01) | |
| C30B 29/20 | (2006.01) | |

(56) References Cited

U.S. PATENT DOCUMENTS

| | | | |
|---|---|---|---|
| 5,508,092 A | 4/1996 | Kimock | |
| 5,942,343 A | 8/1999 | Chen | |
| 6,440,242 B1 | 8/2002 | Fukazawa | |
| 6,528,123 B1 | 3/2003 | Cadden et al. | |
| 6,627,319 B2 | 9/2003 | Jacquiod et al. | |
| 6,916,542 B2 | 7/2005 | Buhay et al. | |
| 6,962,759 B2 | 11/2005 | Buhay et al. | |
| 7,125,926 B2 | 10/2006 | Satoh et al. | |
| 7,311,961 B2 | 12/2007 | Finley et al. | |
| 7,584,689 B2 | 9/2009 | Jones et al. | |
| 7,664,469 B2 | 2/2010 | Hutchison | |
| 7,738,187 B2 | 6/2010 | Pazidis et al. | |
| 7,793,580 B2 | 9/2010 | Jones et al. | |
| 7,966,785 B2 | 6/2011 | Zadesky et al. | |
| 7,998,586 B2 | 8/2011 | Lu et al. | |
| 8,015,970 B2 | 9/2011 | Klun et al. | |
| 8,021,758 B2 | 9/2011 | Sambasivan et al. | |
| 8,025,004 B2 | 9/2011 | Jones et al. | |
| 8,031,174 B2 | 10/2011 | Hamblin et al. | |
| 8,055,003 B2 | 11/2011 | Mittleman et al. | |
| 8,133,599 B2 | 3/2012 | Lu et al. | |
| 8,450,607 B2 | 5/2013 | Du et al. | |
| 8,685,490 B2 | 4/2014 | Lu et al. | |
| 8,728,634 B2 | 5/2014 | Medwick et al. | |
| 8,790,796 B2 | 7/2014 | Buhay et al. | |
| 9,617,639 B2* | 4/2017 | Beckmann | C23C 16/513 |
| 2002/0052060 A1* | 5/2002 | Nakajima | C30B 25/02 438/46 |
| 2002/0102819 A1* | 8/2002 | Tamura | C30B 25/02 438/483 |
| 2003/0045103 A1* | 3/2003 | Suzuki | C30B 25/02 438/689 |
| 2003/0228476 A1 | 12/2003 | Buhay et al. | |
| 2004/0102229 A1 | 5/2004 | Hutchison | |
| 2007/0048526 A1 | 3/2007 | Hoffman et al. | |
| 2007/0085163 A1* | 4/2007 | Lee | C30B 25/18 257/499 |
| 2007/0224357 A1 | 9/2007 | Buhay et al. | |
| 2008/0139885 A1 | 6/2008 | Knapp | |
| 2009/0090241 A1 | 4/2009 | Julbe et al. | |
| 2009/0263651 A1 | 10/2009 | Cook | |
| 2010/0027383 A1 | 2/2010 | Suzuki et al. | |
| 2010/0124642 A1 | 5/2010 | Lu et al. | |
| 2011/0155409 A1 | 6/2011 | Du et al. | |
| 2012/0048083 A1* | 3/2012 | Schwerdtfeger | C30B 11/002 83/39 |
| 2012/0172209 A1 | 7/2012 | Lu et al. | |
| 2012/0282489 A1* | 11/2012 | Shin | B82Y 30/00 428/688 |
| 2013/0344321 A1 | 12/2013 | McSporran et al. | |
| 2014/0087160 A1 | 3/2014 | McSporran et al. | |
| 2014/0103362 A1* | 4/2014 | Kuraoka | C30B 19/02 257/76 |
| 2014/0116329 A1 | 5/2014 | Chaudhari | |

FOREIGN PATENT DOCUMENTS

| | | |
|---|---|---|
| DE | 112004001032 | 5/2006 |
| JP | 09008690 | 1/1997 |
| JP | 2008111984 | 5/2008 |
| WO | WO02/054718 | 7/2002 |
| WO | WO2009/025842 | 2/2009 |
| WO | WO2012/088209 | 6/2012 |
| WO | WO2013/134159 | 9/2013 |

OTHER PUBLICATIONS

Chaudhari, P. et al., Heteroepitaxial Silicon Film Growth at 600C. From an Al—Si Eutectic Melt, pp. 5368-5371, Mar. 19, 2010, Thin Solid Films 518, Elsevier, US.

Feng et al., "Strengthening sapphire at elevated temperatures b SiO2 films," Applied Surface Science, Elsevier, Amsterdam, NL, vol. 253, No. 12, Mar. 13, 2007, pp. 5365-5367.

Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.

Klein, Claude et al., "Flexural strength of sapphire: Weibull statistical analysis of stressed area, surface coating, and polishing procedure effects," Journal of Applied Physics, American Institute of Physics, vol. 96, No. 6, Jan. 1, 2004, 8 pages.

Kobrin, P.H. et al., "Compressive thin films for increased fracture toughness," Proceedings of SPIE, vol. 683, Jan. 1, 1986-Aug. 19, 1986, 5 pages.

Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.

Patscheider, Jorg et al., "Plasma-Induced Deposition of Thin Films of Aluminum Oxide," Plasma Chemistry and Plasma Processing, Plenum Press, New York, US, vol. 12, No. 2, Jun. 1, 1992, 17 pages.

Seman, Michael T. et al., "An Analysis of the Deposition Mechanisms involved during Self-Limiting Growth of Aluminum Oxide by Pulsed PEVCD," Chemical Vapor Deposition, Wiley-VCH Verlag, Weinheim, Germany, vol. 14, No. 9/10, Sep. 1, 2008, 7 pages.

Simpson, Todd W. et al., "Kinetics of the Amorphous →γ→α Transformations in Aluminum Oxide: Effect of Crystallographic Orientation," Journal of the American Ceramic Society, vol. 81, No. 1, Jan. 1, 1998, 6 pages.

International Search Report and Written Opinion, PCT Application No. PCT/EP2014/054819, 12 pages, Apr. 30, 2014.

International Search Report and Written Opinion, PCT Application No. PCT/EP2014/054820, 11 pages, Apr. 30, 2014.

International Search Report and Written Opinion, PCT Application No. PCT/US2013/060989, 10 pages, Feb. 5, 2014.

International Search Report and Written Opinion, PCT Application No. PCT/US2013/066193, 11 pages, Jan. 20, 2014.

International Search Report and Written Opinion, PCT Application No. PCT/US2014/029026, 15 pages, Jul. 30, 2014.

U.S. Appl. No. 13/679,493, filed Nov. 16, 2012, Kelvin Kwong.

U.S. Appl. No. 14/033,890, filed Sep. 23, 2013, Douglas Weber et al.

U.S. Appl. No. 14/214,163, filed Mar. 14, 2014, Dale N. Memering et al.

U.S. Appl. No. 14/453,065, filed Aug. 6, 2014, Rudolf Beckmann et al.

* cited by examiner

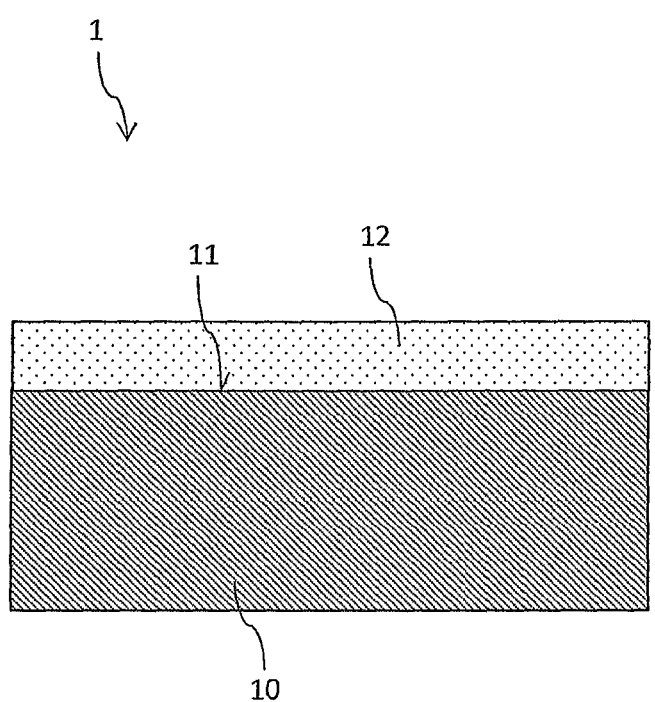

BREAK RESISTANT AND SHOCK RESISTANT SAPPHIRE PLATE

CROSS-REFERENCE TO RELATED APPLICATIONS

This application is a continuation patent application of U.S. patent application Ser. No. 14/216,736, filed Mar. 17, 2014, and titled "Break Resistant and Shock Resistant Sapphire Plate," which claims priority to German Patent Application No. 10 2013 004 559.2, filed Mar. 18, 2013, and titled "Break Resistant and Shock Resistant Sapphire Plate," the disclosures of which are incorporated herein by reference in their entireties.

TECHNICAL FIELD

Embodiments described herein relate to a break resistant and shock protected sapphire plate which is in particular intended to be used as a cover for display devices. Furthermore, embodiments relate to a method for producing said break resistant and shock protected sapphire plate.

BACKGROUND

Mono-crystalline sapphire is characterized by an extraordinary hardness and stretch resistance. Sapphire plates, generally referred to as sapphire glass, are therefore frequently used in the watch industry. It is desirable to broaden the scope of application of sapphire plates and to use them as transparent covers for display devices of electronic devices. It is generally conceivable to equip electronic displays, for example of tablet computers, mobile phones and smartphones, with sapphire plates.

However, due to its crystalline properties, in particular the mono-crystalline structure, sapphire is relatively brittle. Relatively large and thin sapphire plates, as would be required for example as covers for smartphones of tablet computers, therefore have a break resistance during bending and heavy impact, which is insufficient for practical application.

For production reasons, the surface of sapphire plates typically has defects and/or micro-cracks. Such microcracks can propagate relatively fast in the plate material during bending or heavy impact and can ultimately lead to breaking of the sapphire plate.

In the publication of C. M. Liu, J. C. Chen, L. J. Hu, S. P. Lin "The effect of annealing, precipitation-strengthening, and compressive coating processes on sapphire strength", Material Science and Engineering A 420 (2006) 212-219, the hardening of sapphire by means of tempering is described, among others, during which the sapphire plates are heated up to temperatures of at least 1500° C. for a relatively long time, i.e. approximately 24 hours.

Surface defects can be removed. However, the method takes a relatively long time as well as being cost-intensive and energy-intensive. Furthermore, the coating of sapphire substrates with silicon nitride is described as an anti-reflection coating. Due to the subsequent thermal hardening process, to which the coating is subjected for at least an hour at a temperature of 1500° C., the applied silicon nitride layer can crystallize.

Since silicon nitride has a higher density in the crystalline state than in the amorphous state, a compressive stress can be generated on the sapphire surface. As a result, the micro-cracks or defects present on the surface bordering with the applied silicon nitride layer can virtually be pulled together and therefore be minimized. The sapphire plate can therefore be tensioned or pre-tensioned by the coating.

The refractive index of a silicon nitride layer is typically above 1.9. The refraction index of pure silicon nitride is even 1.98. In contrast, mono-crystalline sapphire has an average refraction index of 1.74 in the range of the visible spectrum. The silicon nitride layer alters the optical properties of a sapphire plate.

Consequently, silicon nitride is highly reflective and has a reflectance on sapphire of more than 30%, so that it can generally not be used for coating of cover plates of display devices.

SUMMARY

By contrast, embodiments described herein are based on the task to increase the impact resistance and breaking resistance of a sapphire substrate or a sapphire plate, respectively, while influencing the optical properties of the sapphire plate. In particular, with regard to optical transmission and reflection in the range of the visible spectrum, present embodiments may change these properties as little as possible. Embodiments may also provide an inexpensive, efficient and streamlined method for hardening sapphire plates, which is suitable for industrial mass production.

One embodiment may take the form of a break resistant sapphire plate comprising: a planar sapphire substrate; and at least one shock absorbing layer arranged on the surface of the substrate; wherein the layer has a layer thickness between 0.1% to 10% of a thickness of the substrate.

Another embodiment may take the form of a method for producing a sapphire plate, the method comprising: providing a planar sapphire substrate; and coating at least one surface of the substrate with a shock absorbing layer having a layer thickness between 0.1% to 10% of the thickness of the substrate.

BRIEF DESCRIPTION OF THE DRAWINGS

The disclosure will be readily understood by the following detailed description in conjunction with the accompanying drawings, wherein like reference numerals designate like structural elements, and in which:

FIG. 1 shows a schematic cross section of a surface-tensed sapphire plate according to embodiments.

It is noted that the drawing is not necessarily to scale. The drawing is intended to depict only typical aspects of the embodiments, and therefore should not be considered as limiting the scope of the embodiments. In the drawings, like numbering represents like elements between the drawings.

DETAILED DESCRIPTION

This task is solved by a break resistant sapphire plate according to embodiments, as well as a method for its production according to embodiments.

The sapphire plate comprises a planar sapphire substrate and at least one shock absorbing layer arranged on one of the substrate surfaces. The shock absorbing layer has a thickness between 0.1% and 10% of the thickness of the substrate. Therefore, a comparatively thick layer is applied on the sapphire substrate which can provide a shock absorbing effect for the sapphire substrate underneath it.

The shock absorbing layer comprises a material or a material composition which, in comparison to the sapphire substrate underneath, is comparatively soft and plastically deformable. The shock absorbing layer applied to the substrate surface is supposed to absorb mechanical stress applied on the layer. In particular, the shock absorbing layer absorbs selectively occurring hits or impacts by plastic deformation and generally conducts them within the layer away to the sides. As a result, a mechanical stress applied approximately perpendicular or at an angle on the sapphire plate is attenuated, conducted to the sides or only applied to a lesser extent on the sapphire substrate underneath it.

Besides the layer thickness, the thickness of the sapphire substrate, the substance or material composition of the layer, as well its mechanical connection to the substrate may be of importance.

It may be particularly useful if the layer extends over the entire substrate surface, but only selectively forms a firm connection with the substrate surface. The layer can lie at least sectionally loose on the substrate surface such that the mechanical stress applied to the shock absorbing layer is transferred within the layer, but not transferred unattenuatedly from the layer into the bordering substrate due to a particularly firm and stiff connection of the layer and the substrate.

According to a further embodiment, the layer thickness is 0.5% to 5%, 0.8 to 3%, 1% to 2% or 1.2% to 1.5% of the thickness of the substrate. Embodiments with a layer thickness in the range of 1% to 2% of the substrate thickness prove to be particularly advantageous for the shock absorption. In particular, the impact and hit resistance of a sapphire plate could be noticeably raised during standardized experiments comparable with the so-called ball drop test in accordance with UL-60950. During this test, a steel ball weighing 0.5 kg is dropped on the plate from a height of 1.3 m. Afterwards, the sapphire plates mechanically treated this way are subjected to a bending or breaking test.

This has shown that the sapphire substrate equipped with the shock absorbing layer has a significantly higher bending stiffness and breaking resistance in comparison to comparative but uncoated sapphire substrates even after the ball drop test.

According to a further embodiment, the sapphire substrate has a thickness of 200 µm to 2 mm, 300 µm to 1.5 mm, 500 µm to 1 mm or 600 µm to 800 µm. Also, embodiments can be provided which have a sapphire substrate thickness smaller than 1 mm, smaller than 800 µm, smaller than 600 µm or smaller than 400 µm. At a typical thickness of the sapphire substrate of approximately 0.4 mm, the thickness of the layer applied to the substrate can be 4 µm and higher.

According to a further embodiment, it is provided that the layer thickness independent of the sapphire substrate thickness is at least 1 µm, at least 2 µm, at least 3 µm, at least 4 µm or at least 5 µm.

The layer thickness can typically be chosen with regard to the substrate thickness. Furthermore, the optical properties of the shock absorbing layer are to be considered. Ideally, the shock absorbing layer has similar, almost identical optical properties as the planar sapphire substrate underneath it. Therefore, the optical properties of a sapphire plate produced this way, even after application of a comparatively thick layer on the planar sapphire substrate, can be almost unchanged in comparison to the sapphire substrate.

According to a further embodiment, the connection between the sapphire substrate and the shock absorbing layer perpendicular to the axis of the sapphire substrate has a smaller tensile strength than the sapphire substrate and/or the layer itself. The adhesion between the substrate surface and the layer is to be comparatively, minimally formed such that with regard to a microscopic scale, the layer is only sectionally connected with the substrate surface.

Such a comparatively loose arrangement of the layer and the substrate surface is advantageous for the shock absorption of the applied layer and for conducting mechanical impacts within the layer. Due to the comparatively, minimal adhesion between the shock absorbing layer and the sapphire substrate, a local elastic or plastic deformation of the layer is not immediately transmitted into the sapphire substrate beneath it. The quality of the adhesion of the layer on the substrate surface is chosen according to the respective coating process, such that the layer in its entirety is removable from the sapphire substrate due to a force applied directly in the direction of the surface normal and applied inversely on the sapphire substrate and the layer.

The surface compound between the substrate surface and the layer applied on the substrate is therefore to be formed more weakly than the tensile strength of the layer, as well as the tensile strength of the sapphire substrate itself.

The layer here has at least 50 wt.-% of aluminum oxide (Al2O3). Since sapphire substantially contains crystalline aluminum oxide, applying a layer having a high amount of aluminum oxide to a sapphire substrate alters its optical properties marginally, at the most.

It initially seems to be counter-intuitive to apply an aluminum oxide layer to a sapphire substrate. However, experiments have shown, that by coating the sapphire substrate with a layer having at least 50 wt.-% of aluminum oxide, the break resistance, the impact resistance, as well as the bending strength of the sapphire substrate increases. Thus, the physical properties of the sapphire substrate and/or the sapphire plate with the at least one layer can be increased significantly in comparison to the uncoated sapphire substrate.

Due to the high amount of aluminum oxide in the layer applied to the sapphire substrate, the optical properties of the sapphire substrate are altered, if at all, only negligibly.

According to a further embodiment, the layer comprises amorphous aluminum oxide. This has a higher thermal expansion coefficient in comparison to a crystalline aluminum oxide, i.e. in comparison to sapphire. Since the coating process is done at significantly elevated temperatures compared to room temperature, approximately in the range from 300° C. to 500° C., in particular in the range of approximately 400° C., the applied layer contracts during cooling of the coated sapphire plate significantly more than the sapphire substrate. The layer may apply a compressive stress on the substrate.

According to a further embodiment, the layer applied to the sapphire substrate substantially comprises aluminum oxide. It can also substantially consist of aluminum oxide. It is, however, also conceivable, and due to the respective coating process, that the layer applied to the sapphire substrate also comprises other components or materials.

It is insofar conceivable that the layer comprises at least 60 wt.-% of aluminum oxide, at least 70 wt.-% of aluminum oxide, at least 80 wt.-% of aluminum oxide or even more than 90 wt.-% of aluminum oxide.

According to a further embodiment, besides aluminum oxide, the layer comprises carbon, hydrogen and/or nitrogen. In particular, the layer can comprise 0 to 5 wt.-% carbon, 0 to 10 wt.-% of hydrogen and/or 0 to 5 wt.-% of nitrogen. These additional materials in the layer are intrinsically included in the layer due to the coating processes.

If, for example, a plasma-assisted chemical steam separator method, a so-called plasma-CVD process, is used to apply the layer, an aluminum oxide deposition on the sapphire substrate can occur especially efficiently with comparatively high deposition rates by supplying trimethylaluminum (TMA) and nitrous oxide. The plasma generation which takes place in a plasma reactor at a predetermined temperature and a predetermined pressure, and the corresponding chemical reaction, can inevitably lead to the inclusion of carbon, hydrogen and/or nitrogen parts in the applied layer.

According to a further embodiment, the layer applied to the sapphire substrate is substantially transparent for electromagnetic radiation in the visible wavelength range. Substantially transparent here means a transmittance of at least 80%, 85% or 90%.

In a further aspect, embodiments relate to a method for producing a break-resistant sapphire plate. In a first method step, a planar sapphire substrate is provided which, in a subsequent step, is provided, in particular coated, with a shock-absorbing layer. At least one surface of the substrate is thereby coated with a break-resistant layer, wherein the layer has a layer thickness between 0.1%-10% of the thickness of the substrate.

This results in the previously described advantages with regard to the breaking resistance and bending flexibility of the sapphire plate, which was shock-protected by the applied layer.

Optionally, the provided planar sapphire substrate can be subjected to a thermal pretreatment prior to the coating process, such as tempering or annealing. Thereby, any micro cracks of the substrate per se present on the substrate surface can at least be closed sectionally, but at least be reduced or minimized.

According to a further embodiment, the layer is applied to the substrate with the assistance of plasma. For this purpose, the substrate is inserted into a plasma treatment chamber, in which a plasma is ignited at a predetermined pressure and a predetermined temperature by introducing at least one or more process gases and by providing energy. Reaction products of the reaction gases inserted into the plasma treatment chamber can be deposited on the surface of the substrate and can form the surface-tensioned layer on the substrate.

According to a further embodiment, the layer can also be applied to the surface of the substrate by way of a sputtering process. A sputtering target is subjected to ion bombardment, whereby target ions are ejected from the target and are finally deposited on the surface of the substrate. Here, as one example one may use a ceramic aluminum oxide target or an aluminum target. When using an aluminum target, oxygen or gases containing oxygen, respectively, are provided in the corresponding reaction chamber to facilitate the formation of aluminum oxide and its deposition on the substrate surface.

According to a further embodiment, the layer is applied to the substrate by way of a plasma-assisted CVD process. As one example a PECVD method (Plasma-Enhanced-Chemical-Vapor-Deposition) is used.

For the plasma-assisted CVD process according to a further embodiment, in certain embodiments trimethylaluminum (TMA) and nitrous oxide are used as reaction gases. The reaction gases trimethylaluminum (TMA) and nitrous oxide are used here in a ratio of at the most 1/2, 1/4, 1/8, 1/16, 1/24 or 1/32. This means that for one part of TMA, there are at least 32 parts of nitrous oxide. The ratio mentioned herein specifies the ratio of the amounts of substance inserted into a plasma reactor per unit of time.

Extensive experiments with varying reaction gas ratios have shown that using a trimethylaluminum to nitrous oxide ratio of approximately 1/16 in a plasma CVD process generates excellent surface-tensioned layers on the sapphire substrate which increase the breaking resistance and bending flexibility of the entire sapphire plate in comparison to the uncoated sapphire substrates. Additionally, the ratio discussed above (e.g., 1/16) increases the breaking resistance and bending flexibility of the entire sapphire plate in comparison to the coated sapphire substrates, which were generated using a different reaction gas ratio.

Using a reaction gas mixture of 16 nitrous oxide parts for each trimethylaluminum part also proves to be especially advantageous for the scratch resistance of the applied layer. The scratch resistance of a layer generated with a process gas mixture ratio of 1/16 is visibly better than the scratch resistance of layers which were generated with a process gas mixture ratio of, for example, 1/8 or 1/32.

In the following description of a sample embodiment, additional features of the embodiment will be explained with reference to the drawing. FIG. 1 shows a schematic cross section of a surface-tensioned sapphire plate.

The sapphire plate shown in FIG. 1 comprises a planar sapphire substrate 10 whose planar surface 11 is provided with a shock-absorbing layer 12. The layer 12 applied to the sapphire substrate 10 can generally comprise different, shock-absorbing materials and substances.

According to a particular embodiment, the layer comprises at least 50 wt.-% of aluminum oxide.

The thickness of the sapphire substrate 10 can be 200 µm to 2 mm, 300 µm to 1.5 mm, 500 µm to 1 mm or 600 µm to 800 mm. Also, embodiments can be provided which have a thickness of the sapphire substrate 10 smaller than 1 mm, smaller than 800 µm, smaller than 600 µm or smaller than 400 µm. A typical thickness of the sapphire substrate 10 is approximately 0.4 mm, and the thickness of the layer 12 applied to the substrate may be 4 µm and more.

Due to a comparatively thick coating 12, for example 0.5% to 1.5% or 0.8% to 1.2% of the substrate thickness, a particularly high shock-absorbing effect may be provided by layer 12. The layer thickness can be approximately 4 µm for a substrate 10 of approximately 400 µm thickness. The layer can however also have a layer thickness of at least 1 µm, at least 1.5 µm, at least 2 µm, at least 3 µm, at least 4 µm or of at least 5 µm independently of the thickness of the sapphire substrate 10.

Sapphire substrate 10 can typically be oriented in parallel with its crystallographic A or C axis to the surface normal of the planar surface 11. That is, either the crystalline A axis or the C axis of the mono-crystalline sapphire substrate 10 can run along the coated substrate surface 11 and it can coincide with the border layer between substrate surface 11 and coating 12.

Layer 12 comprises a comparatively high amount of aluminum oxide, and can be applied to the substrate by way of sputtering or by way of a plasma-assisted steam deposition process at a comparatively high temperature, for example at temperatures between 350° C. and 450° C., and more specifically, for example, at approximately 400° C.

We claim:

1. A sapphire plate, comprising:
   a planar sapphire substrate; and
   at least one shock absorbing layer selectively adhered to portions of a surface of the planar sapphire substrate, wherein the shock absorbing layer has:
   a layer thickness between 0.1% to 10% of a thickness of the substrate; and
   at least 50 wt.-% of amorphous aluminum oxide (Al2O3).

2. The sapphire plate of claim 1, wherein the shock absorbing layer thickness is one of: 0.5% to 5%, 0.8% to 3%, 1% to 2%, or 1.2% to 1.5% of the thickness of the substrate.

3. The sapphire plate of claim 1, wherein the thickness of the sapphire substrate is one of: 200 μm to 2 mm, 300 μm to 1.5 mm, 500 μm to 1 mm or 600 μm to 800 μm.

4. The sapphire plate of claim 1, wherein the shock absorbing layer thickness is one of at least: 1 μm, 1.5 μm, 2 μm, 3 μm, 4 μm or 5 μm.

5. The sapphire plate of claim 1, further comprising a connection positioned between the sapphire substrate and the shock absorbing layer, perpendicular to an axis of the sapphire substrate, wherein the connection has a smaller tensile strength than at least one of the sapphire substrate or the shock absorbing layer.

6. The sapphire plate of claim 1, wherein the coated surface of the sapphire substrate substantially coincides with the crystalline A axis of sapphire.

7. The sapphire plate of claim 1, wherein the shock absorbing layer consists of aluminum oxide (Al2O3).

8. The sapphire plate of claim 1, wherein the shock absorbing layer comprises at least one of: 0 to 5 wt.-% of carbon, 0 to 10 wt.-% of hydrogen, and 0 to 5 wt.-% of nitrogen.

9. The sapphire plate of claim 1, wherein the coated surface of the sapphire substrate substantially coincides with the crystalline C axis of sapphire.

10. The sapphire plate of claim 1, wherein the shock absorbing layer is substantially transparent to electromagnetic radiation in a visible wavelength.

11. The sapphire plate of claim 1, wherein the sapphire substrate includes a first thermal expansion coefficient, and the shock absorbing layer includes a second thermal expansion coefficient, distinct from the first thermal expansion coefficient of the sapphire substrate.

12. A sapphire composite, comprising:
a sapphire component exhibiting a first tensile strength; and
a layer having a thickness of 0.1% to 10% of a thickness of the sapphire component and exhibiting a second tensile strength and coupled to the sapphire component along an interface defined between the sapphire component and the layer, wherein:
a tensile strength of the composite at the interface is less than the first and second tensile strengths; and
the layer has at least 50 wt.-% of amorphous aluminum oxide (Al2O3).

13. The sapphire composite of claim 12, wherein the layer is configured to distribute force received at the layer away from the sapphire component.

14. The sapphire composite of claim 12, wherein:
the sapphire component has a first hardness; and
the layer has a second hardness that differs from the first hardness.

15. The sapphire composite of claim 12, wherein the layer is coupled to the sapphire component via at least one of:
a sputtering process; and
a plasma-assisted CVD process.

16. A sapphire composite, comprising:
a sapphire structure;
a layer adhered directly to the sapphire structure and having at least 50 wt.-% of aluminum oxide (Al2O3) and a thickness between 0.1% to 10% of a thickness of the substrate;
and an array of connections positioned along an interface between the sapphire structure and the layer, wherein the layer is affixed to the sapphire structure at the array of connections.

17. The sapphire composite of claim 16, wherein each of the array of connections defines a localized region of the layer that is affixed to the sapphire structure.

18. The sapphire composite of claim 16, wherein the layer is configured to deform.

19. The sapphire composite of claim 16, wherein the layer is separable from the sapphire structure in response to an impact force.

20. The sapphire composite of claim 16, wherein a thickness of the layer is at least 1% of a thickness of the sapphire substrate.

* * * * *